(12) United States Patent
Huang

(10) Patent No.: US 6,945,799 B2
(45) Date of Patent: Sep. 20, 2005

(54) ELECTRICAL CONNECTOR ASSEMBLY WITH READILY REMOVABLE PICK UP CAP

(75) Inventor: Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/863,316

(22) Filed: Jun. 7, 2004

(65) Prior Publication Data
US 2004/0248442 A1 Dec. 9, 2004

(30) Foreign Application Priority Data
Jun. 6, 2003 (TW) ...................................... 92210428 U

(51) Int. Cl.⁷ .............................................. H01R 13/44
(52) U.S. Cl. ........................ 439/135; 439/940; 439/41
(58) Field of Search ................................ 439/135, 136, 439/940, 41

(56) References Cited

U.S. PATENT DOCUMENTS

| 5,026,295 A | 6/1991 | Fong et al. |
|---|---|---|
| 5,249,977 A | 10/1993 | Tanaka et al. |
| 5,651,684 A | 7/1997 | Northey et al. |
| 5,681,174 A | 10/1997 | Correll, Jr. et al. |
| 6,413,111 B1 | 7/2002 | Pickles et al. |
| 6,478,588 B1 * | 11/2002 | Howell et al. ............... 439/135 |
| 6,561,825 B1 * | 5/2003 | McHugh et al. ............ 439/135 |
| 6,655,970 B2 * | 12/2003 | Tsai ............................ 439/135 |

* cited by examiner

Primary Examiner—Tho D. Ta
Assistant Examiner—Felix O. Figueroa
(74) Attorney, Agent, or Firm—Wei Te Chung

(57) ABSTRACT

An electrical connector assembly (1) includes an electrical connector (2) and a pick up cap (3) mounted onto the connector. The connector (2) includes an insulative housing (20) and a multiplicity of terminals (21) received therein. The pick up cap includes a base portion (30), and first and second extending portions (31, 32) extending from opposite ends of the base portion respectively. A first and second clasp (312, 321) respectively depends from a corresponding cantilever end of the first and second extending portions. The first clasps outwardly form a pair of symmetric protrusions (3120) at distal ends thereof respectively. A latching arm (322) interconnects distal ends of the second clasps. The housing defines latching portions (2005) and a latching protrusion (2013) corresponding to the protrusions and the latching arm, respectively.

7 Claims, 7 Drawing Sheets

ELECTRICAL CONNECTOR ASSEMBLY WITH READILY REMOVABLE PICK UP CAP

BACKGROUND OF THE INVENTION

1. Field of the Invention

The present invention relates to an electrical connector assembly which comprises an electrical connector and a pick up cap, the pick up cap being mounted onto the connector for providing a plane top surface to be engaged by a vacuum suction device, whereby the connector assembly can be moved onto a circuit substrate such as a printed circuit board (PCB) on which the electrical connector is to be mounted.

2. Description of the Prior Art

As electronics technology continually develops, manual assembly in mass production facilities is being steadily replaced by automatic assembly. In general, automatic attachment of an electrical connector to a printed circuit board (PCB) involves a vacuum pick up device that picks up the electrical connector from one position and places it in another position. U.S. Pat. Nos. 6,413,111, 5,681,174, 5,651,684, 5,249,977 and 5,026,295 show that the electrical connector needs to have a plane top surface in order for it to be reliably engaged by the vacuum pick up device. An article entitled "MicroPGA Packages" (CONNECTOR SPECIFIER, May 2000, pp.16~18) discloses an electrical connector for an electronic device. The connector defines a rectangular through hole in a center thereof for dissipating heat produced by the electronic device. Therefore, the connector cannot be directly engaged by a vacuum pick up device. Generally, the connector is provided with a pick up cap, so that the combination can be engaged by the vacuum pick up device.

Referring to FIGS. 7 and 8, a conventional electrical connector assembly 6 comprises an electrical connector 8 and a pick up cap 9 mounted on the connector 8. The connector 8 comprises an insulative housing 80 and a multiplicity of electrical terminals. 81 received therein. The housing 80 is substantially a rectangular substrate, and is formed from dielectric material such as LCP (liquid crystal polymer) that can endure soldering temperatures. The housing 80 comprises a rectangular cavity 801 in a middle portion thereof, for receiving an electrical package, such as a central processing unit (CPU) therein, and a pair of opposite lateral sidewalls 800. A multiplicity of terminal-passages 803 is defined in a portion of the housing 80 around the cavity 801, for receiving a corresponding number of the terminals 81 therein. Two latching protrusions 8000 are defined in respective outside of the sidewalls 800 in a middle thereof. A cross-section of the latching protrusion 8000 is generally triangular.

The pick up cap 9 mounted on the electrical connector 8 includes a base portion 91 having a plane top surface, and first and second extending portions 92, 93 extending from opposite ends of the base portion 91 respectively. The first and second extending portions 92, 93 and the base portion 91 are formed on the pick up cap 9 in alternate fashion, for being received on the two opposite lateral sidewalls 800 respectively. The first extending portion 92 comprises two parallel first arms 920, for being received in the sidewall 800 of the housing 80. The second extending portion 93 comprises two parallel second arms 930, for being received in the other sidewall 800 of the housing 80. A connecting portion 921 interconnects distal ends of the first arms 920, for facilitating a user in releasing the pick up cap 9 from the connector 8. A pair of first clasps 922 depends from distal ends of the first arms 920 respectively. A first latching arm 923 interconnects distal ends of the first clasps 922. The two first clasps 922 and the first latching arm 923 cooperatively define a first socket 924 therebetween, for receiving the latching protrusion 8000 of the housing 80 therein. A pair of second clasps 931 depends from distal ends of the second arms 930 respectively. A second latching arm 932 interconnects distal ends of the second clasps 931. The second clasps 931 and the second latching arm 932 cooperatively define a second socket 933 therebetween, for receiving the other latching protrusion 8000 of the housing 80 therein.

In assembly, the pick up cap 9 is placed on the connector 8, with the first and second latching arms 923, 932 loosely resting on the corresponding sidewalls 800 respectively. Then, the pick up cap 9 is pressed down. The first and second latching arms 923, 932 deflect outwardly The first and second latching arms 923, 932 respectively rides along an outer face of the latching protrusions 8000 until the latching protrusions 8000 are received in the first and second sockets 924, 933 respectively. The pick up cap 9 is thereby securely mounted onto the connector 8. A nozzle of the vacuum suction device (not shown) can then engage the plane surface of the base portion 90, in order to move the connector assembly 6 to a desired location on the PCB.

In the above-described assembly process, the latching protrusions 8000 are formed on respective outer faces of the sidewalls 800, and are engaged in the first and second sockets 924, 933. When the pick up cap 9 is detached from the housing 80, a user applies force on the connecting portion 921 of the pick up cap 9, which is typically in an inclined direction as indicated by arrow F in FIG. 8. Force F comprises the component force Fx acting along a direction parallel to the pick up cap 9, and the component force Fy acting perpendicularly upwardly relative to force Fx. The effect of force Fx is to make the engagement between the pick up cap 9 and the housing 80 tighter. As a result, it is difficult to detach the second latching arm 923 from the corresponding latching protrusion 8000. The force F applied on the connecting portion 921 needs to be considerable in order to be able to detach the pick up cap 9 from the connector 8.

Thus, there is a need to provide a new electrical connector assembly that overcomes the above-mentioned disadvantages.

SUMMARY OF THE INVENTION

Accordingly, one main object of the present invention is to provide an electrical connector assembly which has an electrical connector and a pick up cap mounted on the connector, wherein the pick up cap can be readily detached from the connector.

To fulfill the above-mentioned object, an electrical connector assembly in accordance with a preferred embodiment comprises an electrical connector and a pick up cap mounted on the electrical connector. The connector includes an insulative housing and a multiplicity of terminals received therein. The housing has four raised sidewalls and the four sidewalls cooperatively define a generally rectangular space therebetween for receiving an electronic package such as a central processing unit (CPU) therein. Two opposite sidewalls respectively define a central mounting portion therein. The sidewalls and the mounting portions cooperatively respectively define a concave portion therebetween. Two lateral walls are defined at opposite sides of the concave portion respectively. Each lateral wall comprises a recessed first latching portion. A latching protrusion is formed on an outside of the other central portion. The pick up cap includes a base portion, and first and second extending portions extending from opposite ends of the base portion respectively. The first extending portion comprises two parallel first arms. A connecting portion interconnects distal ends of the first arms, for facilitating a user in releasing the pick up cap from the connector. A pair of first and second clasps respectively depends from the corresponding distal end of the first and second extending portions. The first clasp outwardly form a pair of symmetric protrusions at distal ends thereof respectively, corresponding to the first latching portions of the housing. A latching arm interconnects distal ends of the second clasps. The second clasps and the latching arm cooperatively define a latching socket therebetween, for receiving the latching protrusion therein.

When the pick up cap is subsequently detached from the connector, a user applies force on the connecting portion of the pick up cap, which is typically in an inclined direction. This force comprises a component force acting along a direction parallel to the pick up cap, and a component force acting vertically upwardly. The component force acting parallel to the pick up cap has negligible effect on the engagement between the pick up cap and the housing. This is because the engagements of the protrusions with the first latching portions comprise forces acting along directions parallel to the sidewall of the housing. Therefore the force that needs to be applied by the user on the connecting portion is less than that required for conventional electrical connector assemblies, which facilitates convenient detachment of the pick up cap from the connector.

Other objects, advantages and novel features of the present invention will become more apparent from the following detailed description when taken in conjunction with the accompanying drawings, in which:

DESCRIPTION OF PREFERRED
EMBODIMENTS OF THE INVENTION

Reference will now be made to the drawings to describe the present invention in detail.

Figure 1:
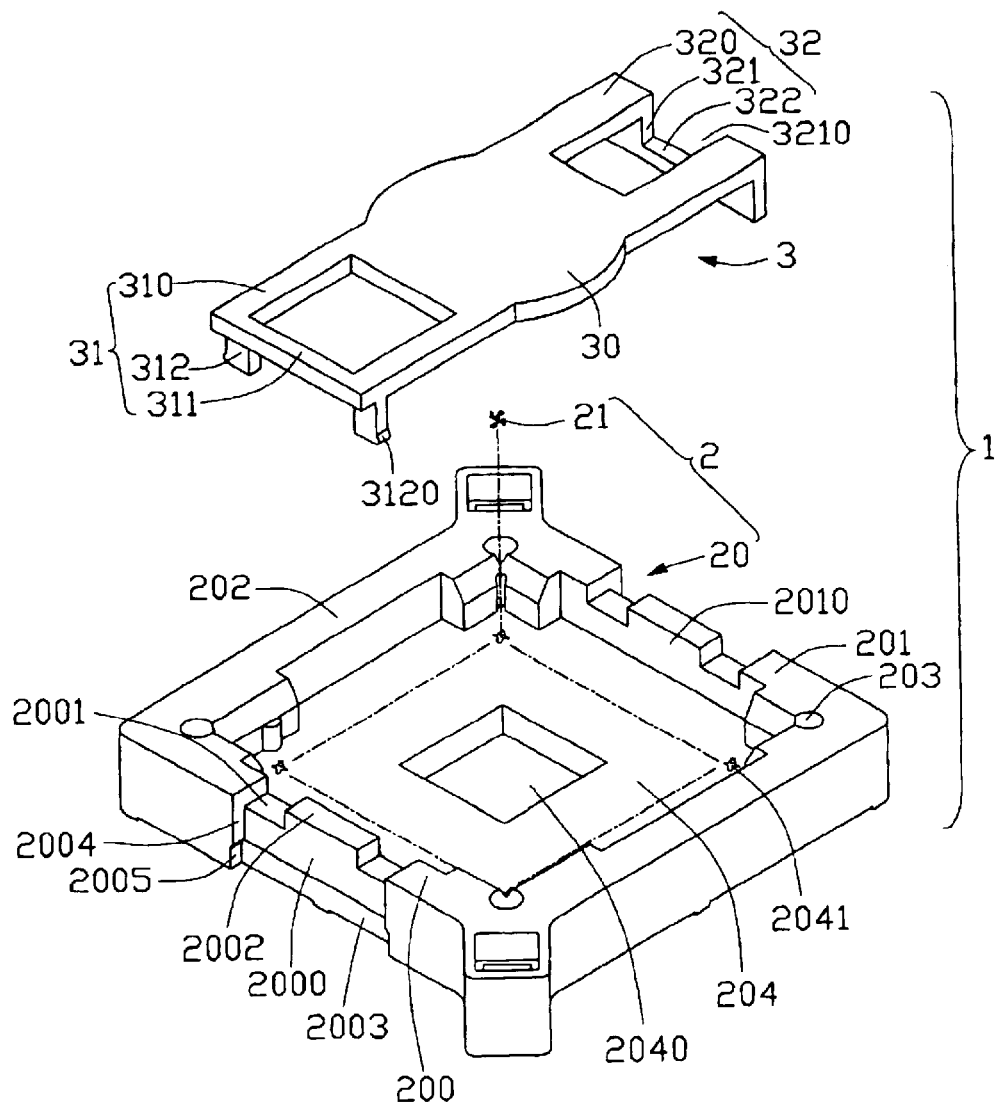
FIG. 1 is a simplified, exploded, isometric view of an electrical connector assembly in accordance with the preferred embodiment of the present invention, the connector assembly comprising an electrical connector and a pick up cap mounted onto the connector.
Figure 2:
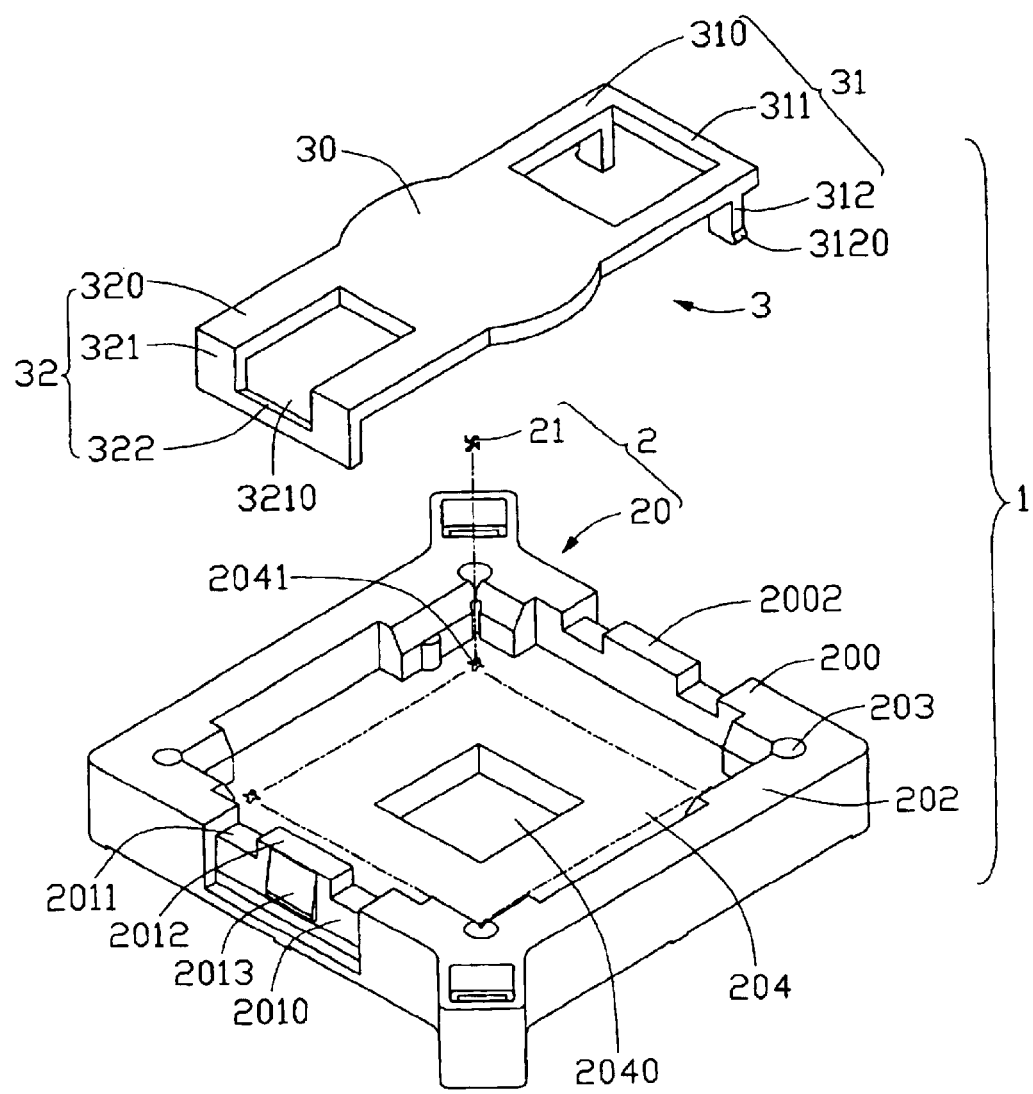
FIG. 2 is similar to FIG. 1, but viewed from another aspect.
Figure 3:
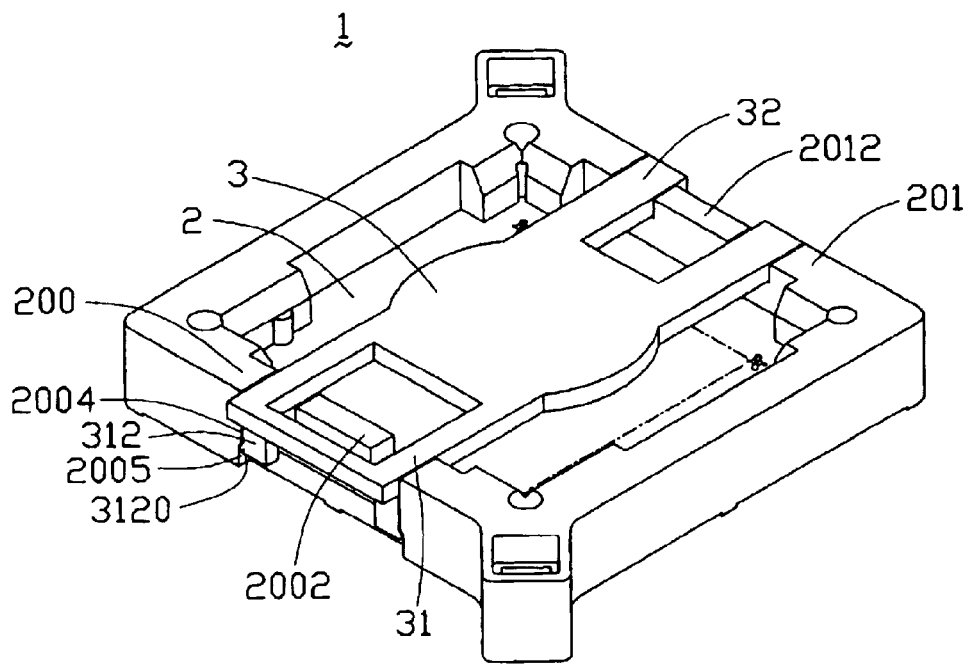
FIG. 3 is an assembled view of FIG. 1.
Figure 4:
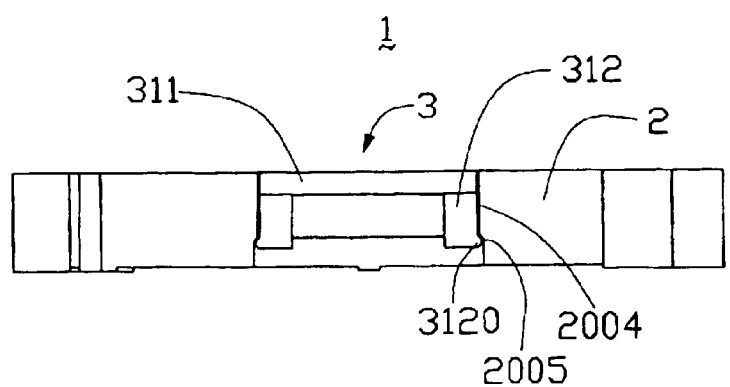
FIG. 4 is a front side elevation view of FIG. 3.

FIGS. 1 and 2 each show a simplified, exploded isometric view of an electrical connector assembly 1 in accordance with the preferred embodiment of the present invention. The electrical connector assembly 1 comprises an electrical connector 2 and a pick up cap 3. The pick up cap 3 is mounted onto the connector 2, for providing a plane surface to be engaged by a vacuum suction device (not shown). The electrical connector assembly 1 can thereby be moved onto a circuit substrate, such as a printed circuit board (PCB) (not shown), on which the connector 2 is to be mounted.

The connector 2 comprises an insulative housing 20, and a multiplicity of terminals 21 received in the housing 20. The housing 20 is substantially a rectangular substrate, and is formed from dielectric material such as LCP (liquid crystal polymer) that can endure soldering temperatures. The housing 20 comprises a base 204, a transverse first sidewall 200, a transverse second sidewall 201 opposite to the first sidewall 200, and two opposite longitudinal third sidewalls 202 interconnecting the first and second sidewalls 200, 201. The base 204 and the first, second and third sidewalls 200, 201 and 202 cooperatively define a space therebetween for receiving a CPU package (not shown) therein. The base 204 defines a rectangular cavity 2040 in a middle thereof. A multiplicity of terminal-passages 2041 is defined in the base 204 around the cavity 2040, for receiving a corresponding number of terminals 21 therein. The first and second sidewalls 200, 201 respectively define central first and second mounting portions 2000, 2010 therein, for receiving the pick up cap 3 thereon. The first and second mounting portions 2000, 2010 respectively comprise raised first and second central portions 2002, 2012. A pair of recessed first receiving portions 2001 is defined in the first mounting portion 2000 at opposite sides of the first central portion 2002 respectively. A pair of recessed second receiving portions 2011 is defined in the second mounting portion 2010 at opposite sides of the second central portion 2012 respectively. The first sidewall 200 and the first mounting portion 2000 cooperatively define a first concave portion 2003 therebetween. Two lateral walls 2004 are defined at opposite sides of the first concave portion 2003 respectively. Each lateral wall 2004 comprises a recessed first latching portion 2005. A latching protrusion 2013 is formed on an outside of the second central portion 2012. A cross-section of the latching protrusion 2013 is generally triangular. Four circular holes 203 are defined in four corners of the housing 20 respectively, for insertion of fasteners (not shown) therethrough in order to mount the connector 2 onto the PCB (not shown).

The pick up cap 3 comprises a base portion 30 having a plane top surface, and first and second extending portions 31, 32 extending from opposite ends of the base portion 30 respectively. The first extending portion 31 comprises two parallel first arms 310, for being received in the first receiving portions 2001 of the housing 20. The second extending portion 32 comprises two parallel second arms 320, for being received in the second receiving portions 2011 of the housing 20. A first connecting portion 311 interconnects distal ends of the first arms 3 10, for facilitating a user in releasing the pick up cap 3 from the connector 2. A pair of first clasps 312 depends from the distal ends of the first arms 310 respectively. The first clasps 312 outwardly form a pair of symmetric protrusions 3120 at distal ends thereof respectively, corresponding to the first latching portions 2005 of the first sidewall 200. A pair of second clasps 321 depends from distal ends of the second arms 320 respectively. A latching arm 322 interconnects distal ends of the second clasps 321. The second clasps 321 and the latching arm 322 cooperatively define a latching socket 3210 therebetween, for receiving the latching protrusion 2013 therein.

Referring to FIGS. 1–4, in assembly of the electrical connector assembly 1, the pick up cap 3 is placed on the connector 2, with the first and second arms 310, 320 loosely resting on the first and second receiving portions 2001, 2011 respectively. Then the pick up cap 3 is pressed down. The first clasps 312 ride along the corresponding lateral walls 2004 until the protrusions 3120 of the first clasps 312 are snappingly received in the first latching portions 2005.

Simultaneously, the second latching arm 322 rides along an outer face of the latching protrusion 2013 until the latching protrusion 2013 is received in the latching socket 3210. The pick up cap 3 is thereby securely mounted onto the connector 2. A nozzle of the vacuum suction device (not shown) can then engage the plane surface of the base portion 30, in order to move the connector assembly 1 to a desired location on the PCB.

When the pick up cap 3 is subsequently detached from the connector 2, a user applies force on the connecting portion 311 of the pick up cap 3, which is typically in an inclined direction. This force F comprises a component force acting along a direction parallel to the pick up cap 9, and a component force acting vertically upwardly. The component force acting parallel to the pick up cap 9 has negligible effect on the engagement between the pick up cap 3 and the housing 20. This is because the engagements of the protrusions 3120 with the first latching portions 2005 comprise forces acting along directions parallel to the sidewall 200 of the housing 20. Therefore the force that needs to be applied by the user on the connecting portion 311 is less than that required for conventional electrical connector assemblies, which facilitates convenient detachment of the pick up cap 3 from the connector 2.

Figure 5:
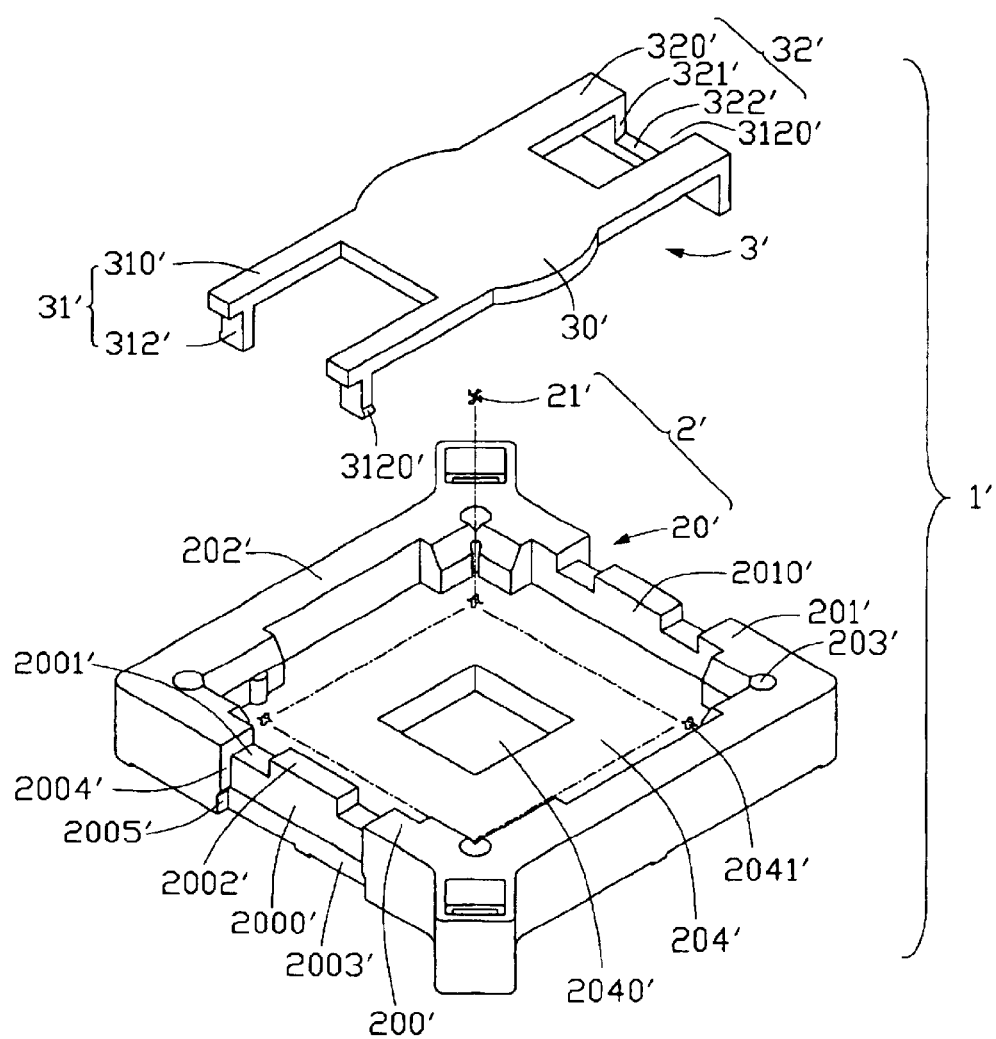
FIG. 5 is a simplified, exploded, isometric view of an electrical connector assembly in accordance with an alternative embodiment of the present invention.

Referring to FIG. 5, an electrical connector assembly 1' in accordance with the alternative embodiment of the present invention has a structure similar to that of the connector assembly 1 of the preferred embodiment. In the alternative embodiment, a first extending portion 31' does not have the first connecting portion 311 of the preferred embodiment. Thus an elasticity of first clasps 312' is enhanced, which minimizes the force that is needed to be applied on the pick up cap 3' during its detachment from the connector 2'. Other components of the alternative embodiment are substantially the same as those of the preferred embodiment described above.

Figure 6:
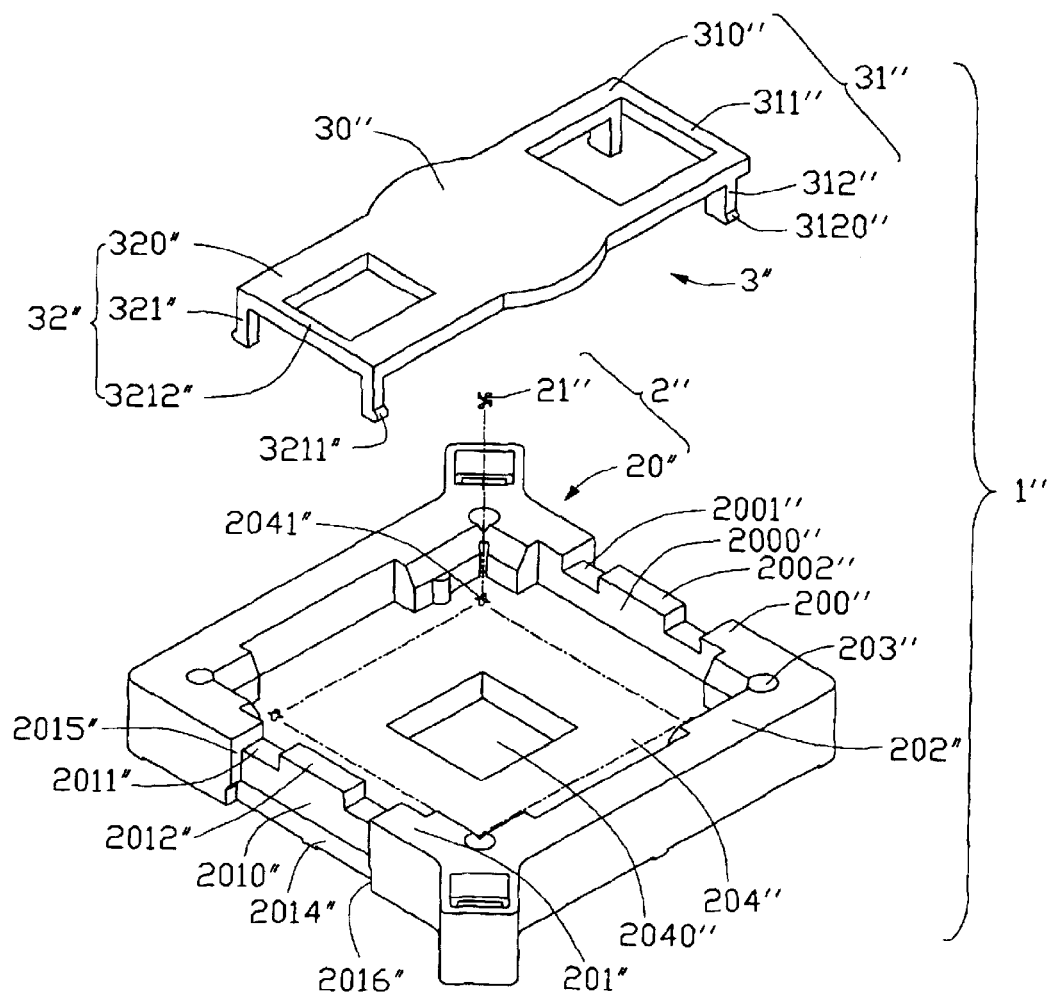
FIG. 6 is a simplified, exploded, isometric view of an electrical connector assembly in accordance with a further alternative embodiment of the present invention.
Figure 7:
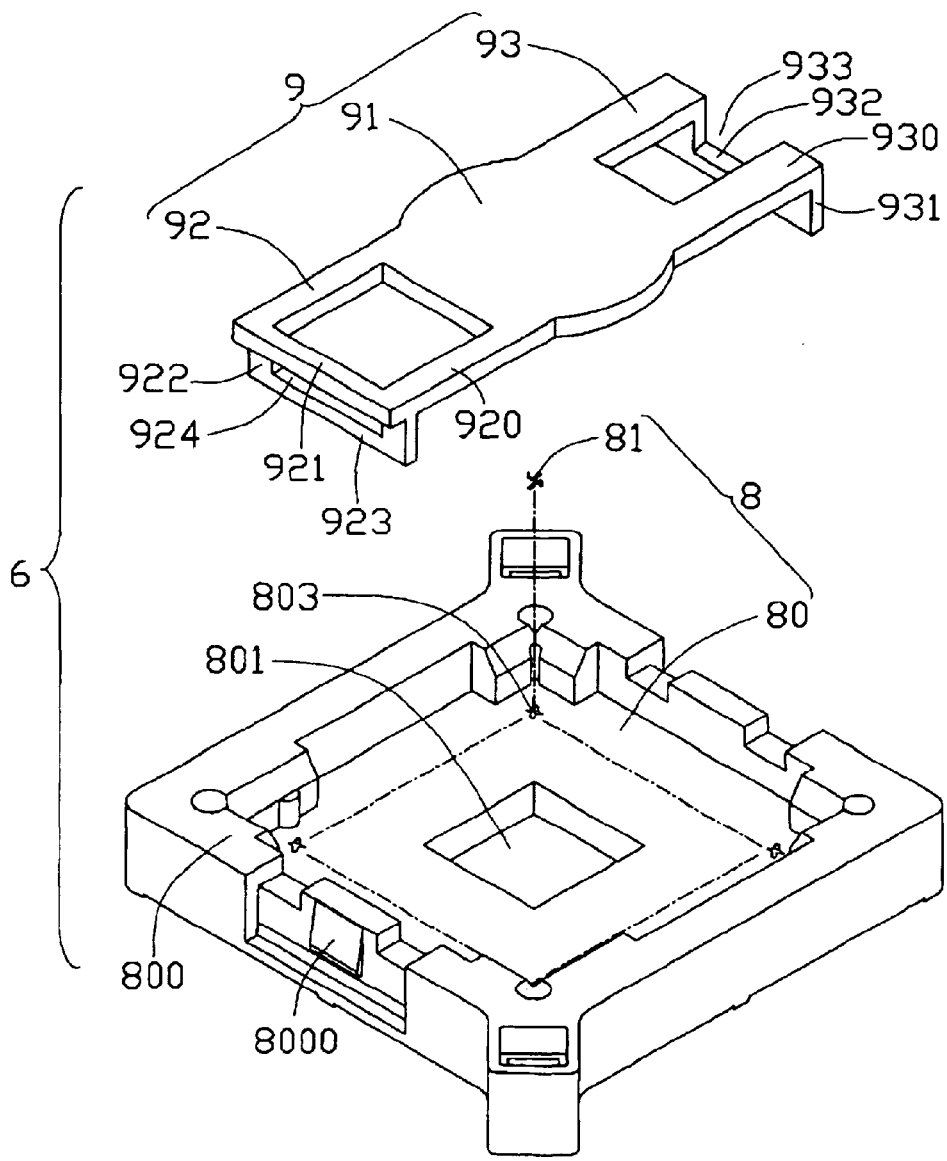
FIG. 7 is a simplified, exploded, isometric view of a conventional electrical connector assembly.
Figure 8:
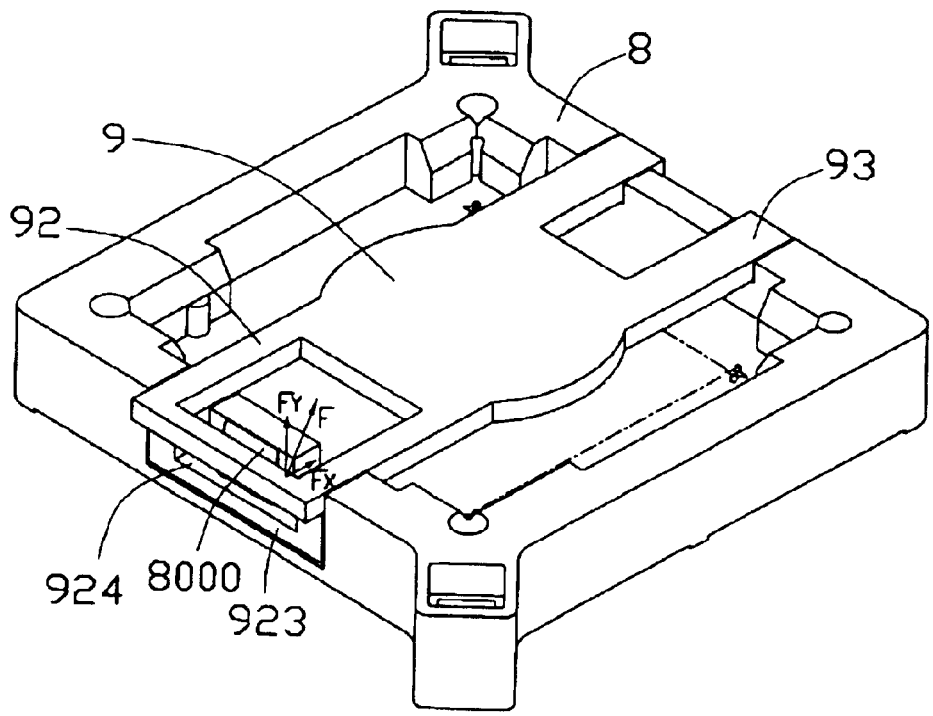
FIG. 8 is an assembled view of FIG. 7.

Referring to FIG. 6, an electrical connector assembly 1" in accordance with a further alternative embodiment of the present invention has a structure similar to that of the connector assembly 1 of the preferred embodiment. In the further alternative embodiment, the electrical connector 2" comprises a first sidewall 200" and a second sidewall 201". The first and second sidewalls 200", 201"each have a structure substantially the same as the first sidewall 200 of the preferred embodiment. The second sidewall 201"defines a second mounting portion 2010"in a middle thereof, for receiving the pick up cap 3" thereon. The second mounting portion 2010" comprises a second central portion 2012", and a pair of second receiving portions 2011" at opposite sides of the second central portion 2012" respectively. The second sidewall 201" and the second mounting portion 2010" cooperatively define a second concave portion 2014" therebetween. Two lateral walls 2015" are defined at opposite sides of the second concave portion 2014" respectively. Each lateral wall 2015" comprises a recessed second latching portion 2016". First and second extending portions 31", 32" of a pick up cap 3" are each the same as the second extending portion 32 of the preferred embodiment. The second extending portion 32" comprises two parallel second arms 320", and a second connecting portion 3212" interconnecting distal ends of the second arms 320". Pairs of first and second clasps 312", 321" depend from corresponding distal ends of the first and second arms 310", 320". The first and second clasps 312", 321" have respective protrusions 3120", 3211", corresponding to first latching portions (not visible) and the second latching portions 2016" of the first and second sidewalls 200", 201".

When the pick up cap 3" is detached from the connector 2", forces applied by a user on a first connecting portion 311" and the second connecting portion 3212" of the pick up cap 3" comprise component forces acting along directions parallel to the pick up cap 3". However, the engagements of the protrusions 3120", 3211" with the corresponding first latching portions (not visible) and second latching portions 2016" comprise forces acting along directions parallel to the sidewalls 200", 201" of the housing 20" respectively. Therefore, the component forces acting parallel to the pick up cap 3" have negligible effect on the engagements between the pick up cap 3" and the housing 20". Thus the forces that need to be applied by the user on the first and second connecting portions 311", 3212" are less than those required for conventional electrical connector assemblies, which facilitates detachment of the pick up cap 3" from the connector 2".

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:

an electrical connector comprising:
an insulative housing defining a plurality of sidewalls adapted for receiving an electronic package therein, at least one sidewall defining on an outside a concave portion having two opposite walls; and
a plurality of terminals received in the housing;
a pick up cap mounted on the housing and comprising:
a base portion having a flat smooth surface to be sucked by a vacuum suction device; and
at least one extending portion extending from one end of the base portion;
wherein the at least one extending portion defining at least one mating member mating with the wall along a direction parallel to the sidewall to reduce the force applied on the pick up cap during detachment of the pick up cap from the connector; wherein the extending portions comprise a first extending portion and a second extending portion opposite to the first extending portion;
wherein each extending portion comprises two parallel arms; wherein the arms comprise first arms and second arms opposite the first arms;
wherein the mating member comprises a first and second clasps depending from distal ends of the first and second arms respectively and a connecting portion interconnecting distal ends of the first arms.

2. The electrical connector assembly of claim 1, wherein the first clasp comprises protrusions disposed thereof.

3. The electrical connector assembly of claim 2, wherein a latching arm interconnects distal ends of the second clasps.

4. The electrical connector assembly of claim 3, wherein the housing defines a first and second receiving portions corresponding to the first and second arms.

5. The electrical connector assembly of claim 4, wherein the housing defines a first mounting portion and a second mounting portion corresponding to the first and second extending portions.

6. The electrical connector assembly of claim 5, wherein the housing defines latching portions and a latching protrusion corresponding to the protrusions and the latching arm.

7. The electrical connector assembly of claim 6, wherein a cross-section of the latching protrusion is generally triangular.

* * * * *